United States Patent
Nauerth

(12) 
(10) Patent No.: US 6,528,999 B1
(45) Date of Patent: Mar. 4, 2003

(54) METHOD OF CORRECTING LINEAR FIELD INHOMOGENEITIES IN A MAGNETIC RESONANCE APPARATUS

(75) Inventor: Arno Nauerth, Erlenbach (DE)

(73) Assignee: Bruker Medical GmbH, Rheinstetten (DE)

(*) Notice: Subject to any disclaimer, the term of this patent is extended or adjusted under 35 U.S.C. 154(b) by 369 days.

(21) Appl. No.: 09/705,824

(22) Filed: Nov. 6, 2000

(30) Foreign Application Priority Data

Nov. 16, 1999 (DE) .......................................... 199 54 926

(51) Int. Cl.⁷ ................................................ G01V 3/00
(52) U.S. Cl. ...................................... 324/309; 324/320
(58) Field of Search ................................. 324/320, 319, 324/318, 314, 312, 309, 307, 306, 300

(56) References Cited

U.S. PATENT DOCUMENTS

| | | | | |
|---|---|---|---|---|
| 5,184,075 A | * | 2/1993 | Nishimura | 324/320 |
| 5,345,178 A | * | 9/1994 | Manabe et al. | 324/320 |
| 5,359,289 A | | 10/1994 | der Meulen | |
| 5,391,990 A | | 2/1995 | Schmitt et al. | |
| 5,770,943 A | * | 6/1998 | Zhou | 324/320 |

* cited by examiner

*Primary Examiner*—Louis Arana
(74) *Attorney, Agent, or Firm*—Paul Vincent

(57) ABSTRACT

The invention concerns a method for correcting linear field inhomogeneities in a magnetic resonance apparatus. After an excitation pulse and application of a phase gradient in a predetermined direction, a data point is taken after a fixed, predetermined time $t_d$. This is repeated for systematically changed strengths of the phase gradient and constant $t_d$. The phase gradient with maximum measuring signal corresponds to a field correction gradient in the corresponding direction.

21 Claims, 2 Drawing Sheets

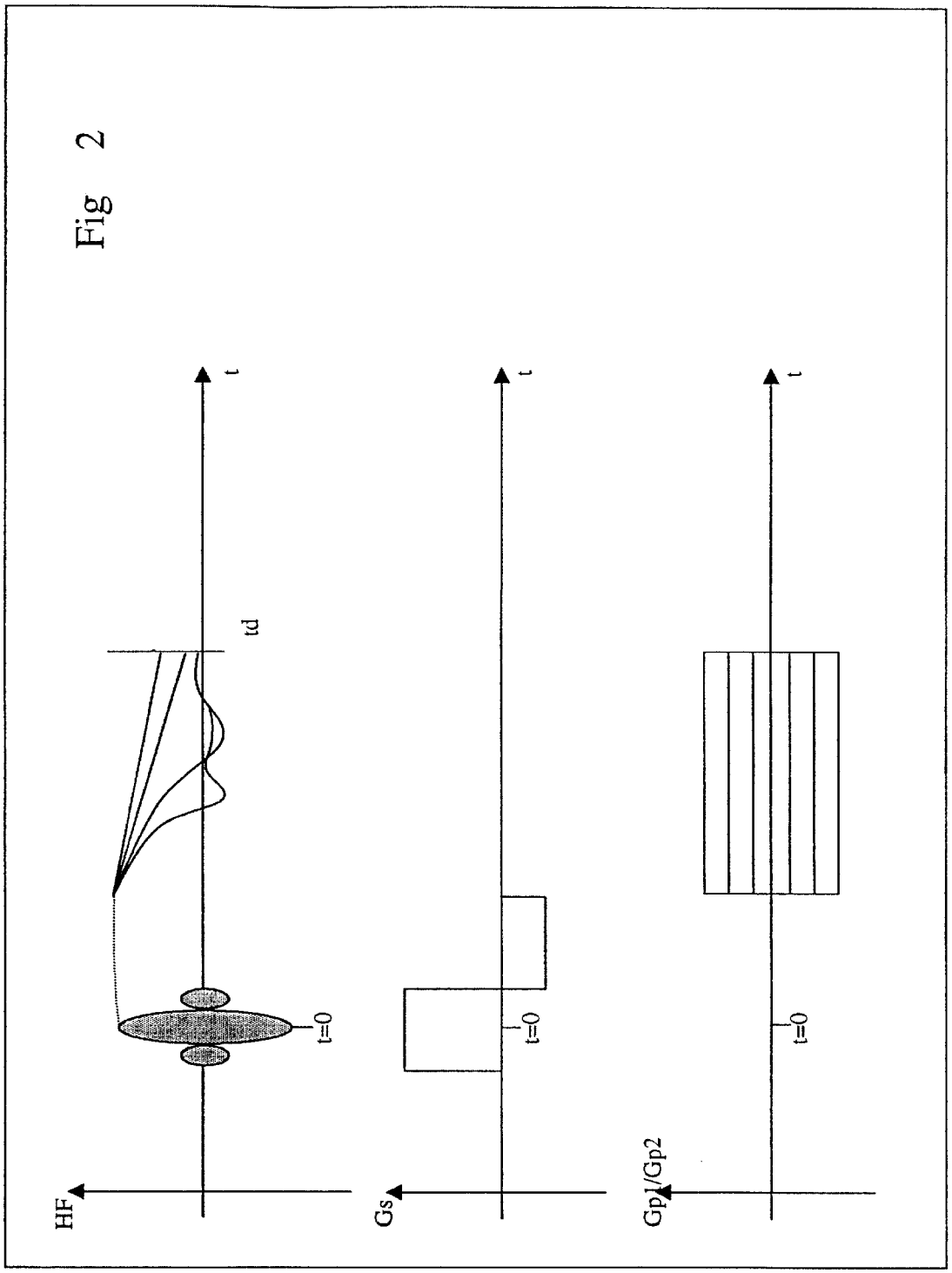

METHOD OF CORRECTING LINEAR FIELD INHOMOGENEITIES IN A MAGNETIC RESONANCE APPARATUS

This application claims Paris Convention priority of DE 199 54 926.5 filed Nov. 16, 1999 the complete disclosure of which is hereby incorporated by reference.

BACKGROUND OF THE INVENTION

The invention concerns a method of correcting linear magnetic field inhomogeneities of a nearly homogeneous magnetic field $B_0$ in the investigation volume of a magnetic resonance apparatus, wherein magnetic resonance is excited in a sample, disposed in the investigation volume, through a radio frequency pulse, at least one additional linear magnetic gradient field is applied, and a magnetic resonance signal is measured.

A method of this type is known e.g. for a nuclear magnetic resonance tomography apparatus disclosed in U.S. Pat. No. 5,391,990.

In the known method, a bipolar gradient pulse train acts on a sample after radio frequency excitation, and a series of echoes is measured and stored in a signal matrix. The (temporal) position of the echo maximum and its displacement between the lines of the matrix are determined and used to calculate correction currents for linear shim coils.

The known method has i.a. the disadvantages that the chemical shift between water and fatty constituents of the signal produces undesired signal modulation and the method cannot be applied in an acceptable manner to samples having short $T_1/T^*_2$ times. In general, several iterations have to be carried out.

For this reason, there is a need for a rapid, uncomplicated direct shimming method which can be made insensitive to the influences of chemical shifts and can be successfully applied with samples having short relaxation times.

SUMMARY OF THE INVENTION

The object is achieved by a method of the above-mentioned type comprising the following steps:

An excitation radio frequency pulse is irradiated onto the sample;

A) a phase gradient $G_{ix}$ is applied in a predetermined direction x;

B) at a fixed time $t_{dx}$ after the radio frequency excitation pulse, a value $S_{ix}$ of the resonance signal coming from the sample is measured, digitized and stored;

C) the steps A) and B) are repeated several times with systematically altered strength of the phase gradient $G_{ix}$;

D) the values of the measured resonance signals $S_i$ are compared and a maximum value $S_{xmax}$ is determined therefrom, to which a certain strength $G_{xmax}$ of the phase gradient is associated;

E) from the strength $G_{xmax}$ of the phase gradient determined in this fashion, a linear correction gradient magnetic field B(x) is determined for the predetermined direction x;

F) in subsequent measurements of magnetic resonance in the apparatus, the correction gradient magnetic field B(x) is applied to the investigation volume for homogenizing the magnetic field $B_0$.

One single measuring point is recorded after a fixed predetermined time after each excitation rather than a complete signal echo. The time $t_d$ is always the same as is therefore the dephasing due to inhomogeneities of the magnetic field $B_0$. Through application of a phase gradient in the interval between t=0 and $t=t_d$, additional dephasing is produced which can be controlled in a defined manner. At the time of data recording, the two effects overlap. Through variation of the strength of the applied phase gradient, one obtains a maximum measuring signal when the dephasing influence of the field inhomogeneities in the respective direction is exactly compensated by the phase gradient. Only non-linear contributions and contributions perpendicular to the gradient direction remain.

One can minimize the influence of chemical shift in that the time $t_d$ is selected such that fatty and water contributions in the $B_0$ field are precisely in-phase at this relative point in time, in any case not of opposite phase.

The time $t_d$ can be selected largely freely, in particular, it can be very short for samples with short relaxation times $T_1/T^*_2$.

Since the applied optimum phase gradient corresponds directly to the correction gradient, iterations are generally not required. Parameters which must be known in other methods, such as the position of the sample in the investigation volume, the resonance frequency or the applied RF performance, must not be exactly determined.

The method has been initially described with reference to one linear dimension but can be easily extended to several dimensions by carrying it out e.g. analogously for a further predetermined direction y which is preferably perpendicular to the direction x. It is not thereby necessary, however possible and preferred, if the above described correction for the x direction has already been carried out. In general, the effects simply add. Compensation in two dimensions is particularly favorable for examination of slices of an object. In multiple slice examinations, the field can be homogenized separately for each slice.

It is of course possible to extend the method in a corresponding manner to three-dimensional volumina by carrying it out analogously for a further predetermined direction z which is preferably perpendicular to the directions x and y. Therein, the field can be homogenized in the entire sample volume or, in connection with volume-selective measures, also for selected partial volumes and possibly for many different volumes within an object.

The easiest way of carrying out the method is to use the maximum measured signal of each respective $S_{ix}$, $S_{iy}$ or $S_{iz}$ as the respective signal maximum $S_{xmax}$, $S_{ymax}$, $S_{zmax}$.

Determination of a more exact, interpolated position is possible if each respective maximum of a smooth function $S_x(G_x)$, $S_y(G_y)$, $S_z(G_z)$ is used as signal maximum $S_{xmax}$, $S_{ymax}$, $S_{zmax}$ which is fitted to the measured gradient strengths in the region of the maximum, preferably by a Gaussian function.

If the correction gradient field is to be determined very precisely and yet within a short time, it is recommended to initially carry out the method in rough gradient steps and then to repeat the steps A) to E) in the vicinity of the determined signal maxima, at least for one direction (x,y,z), thereby determining a refined value of the signal maxima.

A further possibility of increasing the accuracy consists in repeating, at least for one direction (x,y,z), the steps A) to E) for a different, preferably extended $t_{dx}$, $t_{dy}$ or $t_{dz}$.

Limitation to a narrow range about the already determined preliminary maximum is thereby possible. Longer $t_d$ means a longer dephasing time through the remaining inhomogeneities. Since one homogenization step has been carried out already, the signal strength is still sufficient.

The method is preferably a method of nuclear magnetic resonance and, in particular, is incorporated in a method of magnetic resonance imaging. Nuclear magnetic resonance imaging apparatus and, to an increasing extent, high-resolution nuclear magnetic resonance spectroscopy apparatus have gradient coils and shim systems as standard equipment. The method can be integrated into the existing software of, in particular, imaging apparatus without any hardware problems. In particular, it can be added to the actual measurement or be completely integrated therein such that the field is newly homogenized during the investigation program. As mentioned above, homogenization can be carried out individually for separate partial investigation areas.

In a preferred embodiment of the invention, the method is carried out for two preferably orthogonal directions, e.g. x,y and is preceded by a slice selection step, optionally including step A), which selects a slice in the investigation object perpendicular to a direction e.g. z. The selected slice can, for the general case, also be inclined to designated axes.

As an alternative, the method follows a previous volume selection step, optionally including step A), which selects a volume chosen from the investigation object.

With multiple volume experiments or multiple slice experiments, several sets of correction gradient fields are determined which are associated with different volumes or slices.

Correction currents can be determined from the determined correction gradient magnetic fields for feeding into shim coils of the apparatus.

Alternatively or additionally, offset currents can be determined from the determined correction gradient magnetic fields for feeding into gradient coils of the apparatus thereby permitting alteration of said currents in a particularly easy fashion, even during a pulse program.

In an embodiment, the sample comprises biological tissue. The above-mentioned advantages of the invention have a particularly positive effect with inhomogeneous samples having fatty and water constituents whose exact position is possibly not known. The same is true for biological samples such as test animals or also human patients.

Further advantages can be extracted from the drawing and the description. The features mentioned above and below can be used in accordance with the invention either individually or collectively in any arbitrary combination. The embodiments shown and described are not to be understood as exhaustive enumeration, rather have exemplary character for describing the invention.

The invention is shown in the drawings and is explained in more detail by embodiments.

BRIEF DESCRIPTION OF THE DRAWING

FIG. 2 shows a pulse sequence with integrated slice selection.

DESCRIPTION OF THE PREFERRED EMBODIMENT

Figure 1:
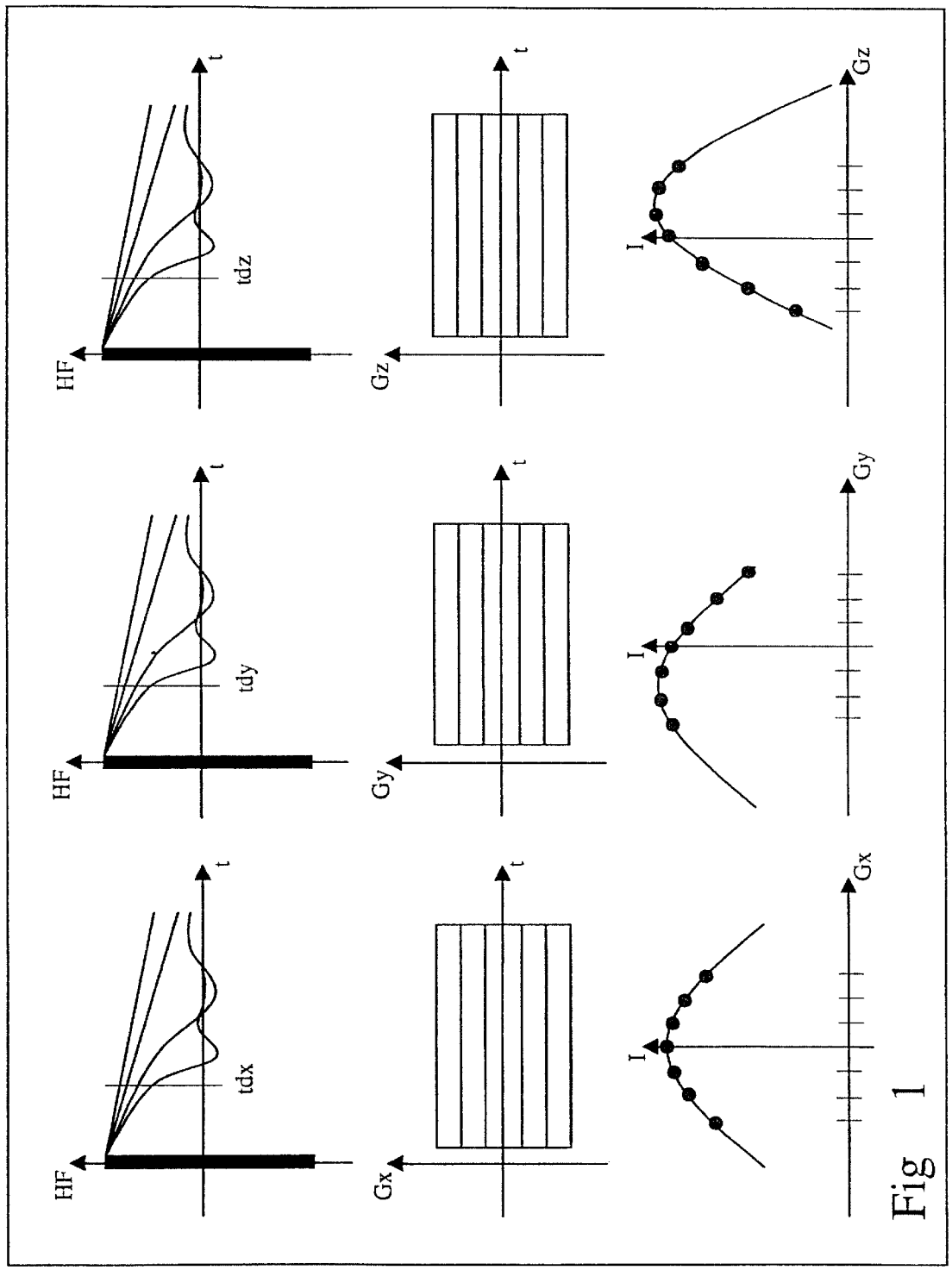
FIG. 1 schematically shows three RF excitations, phase gradients and measuring signals for three orthogonal directions.

The first line of FIG. 1 schematically shows the time dependence of an excited NMR signal following a radio frequency excitation pulse (t=0), symbolized here by a vertical black bar. Each of the following four curves represents the dependence of the signal envelopes after excitation for differing strengths of the respective phase gradient. They are slightly modified by the overlapping field inhomogeneities of the magnetic field $B_0$ to be determined (not shown). Each measurement is carried out at time $t_d$. In FIG. 1, the times $t_d$ are identical for all directions. This is, however, not absolutely necessary.

The second line of FIG. 1 shows respective time dependences of the phase gradients. In the example, the phase gradient is switched on only after the RF pulse and is present during data recording. This is not absolutely necessary. It is only important that the integral of the gradient strength in the time interval between the RF pulse (t=0) and data recording (t=$t_d$) is systematically varied and that $t_d$ remains constant for each direction. If the gradient is constant in the entire interval, the optimum gradient determined for one direction (column in FIG. 1) corresponds exactly to the compensation gradient. Otherwise it is only proportional thereto. In any event an expert can easily calculate the connection.

The third line of FIG. 1 shows the dependence of the respectively measured signal strength on the set gradient strength (more general: integral) for a hypothetical inhomogeneity. The sample is homogeneous in the x direction (first column), i.e. the maximum signal is obtained, for $G_x=0$. A correction gradient magnetic field for this direction is not required.

A signal maximum is obtained in the y direction (second column) with negative gradient $G_y$. For compensation, a gradient magnetic field should be applied which is proportional to the $G_y$ determined for the signal maximum. The proportionality constant depends on the dependence of $G_y$ in the interval between t=0 and t=$t_d$ (second line, second column). If $G_y$ remained constant in this interval, it would be exactly 1.

A maximum of the signal is obtained with positive gradient $G_z$ in the z direction (third column). For compensation, a gradient magnetic field must therefore be applied which is proportional to the $G_z$ determined for this signal maximum. The proportionality constant changes with the dependence of $G_z$ in the interval between t=0 and t=$t_d$ (second line, second column). If $G_z$ remained constant in this interval, it would be exactly 1.

FIG. 2 schematically shows a two-dimensional shimming method with integrated slice selection. The selective excitation pulse occurs in the presence of a slice selection gradient $G_s$ (e.g. slice perpendicular to the z direction) whose dephasing influence is subsequently compensated through gradient inversion in a conventional fashion. At the fixed time $t_d$ after excitation, the nuclear magnetic resonance signal is read out. A phase gradient, comprising two generally mutually orthogonal (e.g. x,y) components $G_{p1}$, $G_{p2}$ within the slice selected by the slice selection gradient $G_s$, acts in the interval between excitation (t=0) and data recording (t=$t_d$). The experiment is repeated with systematically varying components $G_{p1}$, $G_{p2}$ of the phase gradient, wherein the other parameters (excitation, slice selection, detection time $t_d$) remain constant. Subsequently, one signal maximum is determined for each of the two directions of the components $G_{p1}$ and $G_{p2}$ of the phase gradient, as explained in connection with FIG. 1, and one value is obtained for each compensation gradient magnetic field.

It is clear that the integration of the inventive method in a slice selection experiment described in connection with FIG. 2 has only exemplary character. One of average skill in the art will recognize that the method can be combined with many pulse sequences common in magnetic resonance or can be integrated therein.

I claim:

1. A method of correcting linear magnetic field inhomogeneities of a nearly homogeneous magnetic field $B_0$ in the investigation volume of a magnetic resonance apparatus, wherein magnetic resonance is excited in a sample located in the investigation volume via a radio frequency pulse, at least one additional linear magnetic gradient field is applied, and a magnetic resonance signal is measured, the method comprising the steps of:

a) irradiating an excitation radio frequency pulse into the sample;

b) applying a phase gradient in a predetermined direction x;

c) measuring, without application of a read gradient and at a fixed time after said excitation radio frequency pulse, a single point magnetic resonance signal from the sample;

d) digitizing and storing said single point magnetic resonance signal measured in step c);

e) repeating steps a) through d) a plurality of times with systematic modification of a strength of said phase gradient;

f) comparing said single point magnetic resonance signals to determine a maximum value, said maximum value being associated with a specific strength of said phase gradient;

g) determining a linear correction gradient magnetic field for said predetermined direction from said specific strength of said phase gradient; and h) applying said linear correction gradient magnetic field of step g) in subsequent measurements of magnetic resonance in the apparatus to render the magnetic field $B_0$ in the investigation volume homogeneous.

2. The method of claim 1, wherein step b) further comprises applying a phase gradient in a direction y.

3. The method of claim 2, wherein y is perpendicular to x.

4. The method of claim 2, wherein step b) further comprises applying a phase gradient in a direction z.

5. The method of claim 4, wherein z is perpendicular to said directions x and y.

6. The method of claim 1, wherein said maximum value is a respective measured maximum signal.

7. The method of claim 1, wherein said maximum value is a maximum of a smooth function fitted to measured gradient strengths in a vicinity of said maximum value.

8. The method of claim 7, wherein said smooth function is a Gaussian function.

9. The method of claim 1, wherein steps a) through f) are repeated in a vicinity of said maxima value using smaller step sizes of said phase gradient strength to thereby determine said maximum value with improved accuracy.

10. The method of claim 1, wherein steps a) through f) are repeated using a different fixed time in step c).

11. The method of claim 10, wherein said different fixed time is longer than said fixed time.

12. The method of claim 1, wherein, in step h), said subsequent measurements comprise a nuclear magnetic resonance method.

13. The method of claim 1, where said subsequent measurements of step h) comprise a magnetic resonance imaging method.

14. The method of claim 13, further comprising selecting a slice from the sample prior to step b) and determining maximum values in step f) for two directions within said slice.

15. The method of claim 14, wherein said slice is selected during step a) and wherein said two directions are mutually orthogonal.

16. The method of claim 13, further comprising selecting a volume in the sample prior to step b).

17. The method of claim 16, further comprising determining several sets of correction gradient fields associated with different volumes in the sample.

18. The method of claim 1, wherein step h) comprises determining shim coil correction currents and feeding said correction currents into shimming coils of the apparatus.

19. The method of claim 1, wherein step h) comprises determining offset currents and feeding said offset currents into gradient coils of the apparatus.

20. The method of claim 1, wherein the sample comprises biological tissue.

21. The method of claim 1, wherein the sample has at least one of a very short relaxation time $T_1$ and a very short relaxation time $T_2$.

* * * * *